United States Patent
Baldwin et al.

(10) Patent No.: US 6,940,131 B2
(45) Date of Patent: Sep. 6, 2005

(54) MOS ESD CDM CLAMP WITH INTEGRAL SUBSTRATE INJECTION GUARDRING AND METHOD FOR FABRICATION

(75) Inventors: David John Baldwin, Allen, TX (US); Joseph A. Devore, Richardson, TX (US); Robert Steinhoff, Dallas, TX (US); Jonathan Brodsky, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 115 days.

(21) Appl. No.: 10/609,920

(22) Filed: Jun. 30, 2003

(65) Prior Publication Data

US 2005/0007216 A1 Jan. 13, 2005

(51) Int. Cl.$^7$ ............................................... H01L 23/62
(52) U.S. Cl. ..................... 257/355; 257/127; 257/170; 257/356; 257/360; 257/409; 257/452; 257/484; 257/605
(58) Field of Search ............................. 257/127, 170, 257/173, 355–363, 546, 409, 452, 484, 605, 174, 328, 487–496, 339, 372–376, 394–400

(56) References Cited

U.S. PATENT DOCUMENTS

| | | | | |
|---|---|---|---|---|
| 5,274,263 A | * | 12/1993 | Wadsworth | 257/409 |
| 5,371,395 A | * | 12/1994 | Hawkins | 257/361 |
| 6,097,066 A | * | 8/2000 | Lee et al. | 257/355 |
| 6,437,407 B1 | * | 8/2002 | Ker et al. | 257/357 |
| 6,690,067 B2 | * | 2/2004 | Ker et al. | 257/355 |
| 6,798,022 B1 | * | 9/2004 | Kuroda et al. | 257/360 |

* cited by examiner

*Primary Examiner*—Andy Huynh
(74) *Attorney, Agent, or Firm*—Rose Alyssa Keagy; W. James Brady, III; Frederick J. Telecky, Jr.

(57) ABSTRACT

The present invention includes a MOS device (100) that has a P-type substrate (102) and an N-type drain region (104) formed within the substrate (102). An annular N-type source region (106) generally surrounds the drain region (104). The source region (106) serves as both the source for the MOS device (100) and a sacrificial collector guard ring for an electrostatic discharge protection circuit. An annular gate region (110) generally surrounds the drain region (104) and is electrically insulated from the drain region (104) and electrically connected to the source region (106). An annular P-type bulk region (108) generally surrounds the source region (106) and is electrically connected to the source region (106).

24 Claims, 2 Drawing Sheets

MOS ESD CDM CLAMP WITH INTEGRAL SUBSTRATE INJECTION GUARDRING AND METHOD FOR FABRICATION

TECHNICAL FIELD OF THE INVENTION

This invention generally relates to a MOS electrostatic discharge (ESD) charged device model (CDM) clamp with an integral substrate injection guardring and a method for fabrication.

BACKGROUND OF THE INVENTION

Without limiting the scope of the invention, its background is described in connection with semiconductor manufacturing and is best exemplified by methods and processes for fabricating MOS devices. The term "MOS" is used in this application, in its conventional sense, to refer to any insulated-gate-field-effect-transistor, or to integrated circuits (ICs) that include such transistors. The term "N-type" is used in this application to refer to MOS components that reside in regions that have been doped with negatively charged impurities. The term "P-type" is used in this application to refer to MOS components that reside in regions that have been doped with positively charged impurities. The term "ESD" as used in this application refers to electrostatic discharge.

Electrostatic discharge protection circuitry is now an essential component of most modern integrated circuits. IC's contain numerous, extremely small delicate device structures that are very sensitive to electrostatic discharges that occur when the high voltages collect within a circuit and then discharge to ground.

The primary source of electrostatic exposure to ICs is from the human body, and is known as the Human Body Model (HBM) electrostatic discharge source. An electrostatic charge of about 0.6 C (Coulombs) can be induced on a body capacitance of 150 pF (picoFarads), leading to electrostatic potentials of 4 kV (kilovolts) or greater. Any contact by a charged human body with a grounded object, such as the pin of an IC, can result in a discharge for about 100 ns (nanoseconds) with peak currents of several amperes. An electrostatic discharge of this magnitude may result in destruction of the delicate components within the IC.

A second source of electrostatic discharge is from metallic objects, and is known as the Machine Model (MM) electrostatic discharge source. The machine model electrostatic discharge source is characterized by a greater capacitance and lower internal resistance than the human body model electrostatic discharge source. The machine model can result in an electrostatic discharge of significantly higher voltage and duration than the human body model source. As mentioned above, electrostatic discharges of this magnitude have the potential to reduce the service life or destroy delicate components within the IC.

A third electrostatic discharge model is the Charged Device Model (CDM). Unlike the human body model and the machine model sources, the charged device model simulates conditions in which the IC itself becomes charged and discharges to ground. Thus, the electrostatic discharge current flows in the opposite direction in the IC than that of the other modeled sources. Charged device model pulses also have very fast rise times compared to the human body model source.

A significant problem is that if a high voltage is discharged through the pins of an IC package, the discharge can cause gate oxide breakdown of the devices to which it is applied. Gate oxide breakdown occurs when voltage across the gate alters the molecular structure of the gate oxide to a point where it cannot sufficiently insulate the gate from other components of the device. The breakdown may cause immediate destruction of the device, or it may weaken the oxide enough such that failure may occur early in the operating life of the device and thereby cause later device failure in the field.

In MOS integrated circuits, the inputs are typically connected to operate the gate of one or more MOS transistors. Additionally, all pins are provided with protective circuits to prevent excessive voltages from damaging the MOS gates. These protective circuits, which are usually placed between the input and output pads on a chip and the transistor gates to which the pads are connected, are designed to begin conducting, or to undergo breakdown, thereby providing an electrical path to ground when excess voltage occurs. Such protection devices are designed to avalanche (passing a large amount of current, and dissipating the energy of the incoming transient) before the voltage on the input pin can reach levels that would damage the gate oxide. Because the breakdown mechanism is designed to be nondestructive, the protective circuits provide a normally open path that closes only when the high voltage appears at the input or output terminals, harmlessly discharging the device to which it is connected.

A CDM clamp is commonly used to protect devices from high voltage spikes where a pin is connected to a MOS gate. The CDM clamp serves to hold or "clamp" high voltage from an electrostatic discharge, for example, until it can be safely dissipated through protective circuitry. The CDM clamp connects an N-type diffusion region to the pin. A guardring around the CDM clamp, consequently, must be used to prevent latch-up caused by the pin subjected to a voltage below ground. "Latch-up" is the self-sustaining current flow through the device that results when high voltage from the electrostatic discharge activates a normally closed electrical path through the device.

To effectively prevent damage from large voltages, however, the guardring must be relatively large and surround the CDM clamp. Not only does a large guardring consume valuable space within the device, surrounding the CDM clamp with the large guardring forces greater distance between the clamp and the protected device, which reduces the protection afforded to the device. What is needed is a CDM clamp that better protects delicate circuitry from electrostatic discharge and consumes less device area than currently available CDM clamps.

SUMMARY OF THE INVENTION

The present invention includes a MOS device that has a P-type substrate and an N-type drain region formed within the substrate. An annular N-type source region generally surrounds the drain region. The source region serves as both the source for the MOS device and a sacrificial collector guardring for the MOS device when used in an electrostatic discharge protection circuit. An annular gate region generally surrounds the drain region and is electrically insulated from the drain region and the source region. An annular P-type base region generally surrounds the source region and is electrically connected to the source region.

BRIEF DESCRIPTION OF THE FIGURES

For a more complete understanding of the present invention, including its features and advantages, reference is now made to the detailed description of the invention taken in conjunction with the accompanying drawings in which like numerals identify like parts and in which.

DETAILED DESCRIPTION OF THE INVENTION

While the making and using of various embodiments of the present invention are discussed in detail below, it should be appreciated that the present invention provides many applicable inventive concepts that may be embodied in a wide variety of specific contexts. The specific embodiments discussed herein are merely illustrative of specific ways to make and use the invention and do not delimit the scope of the invention.

Figure 1:
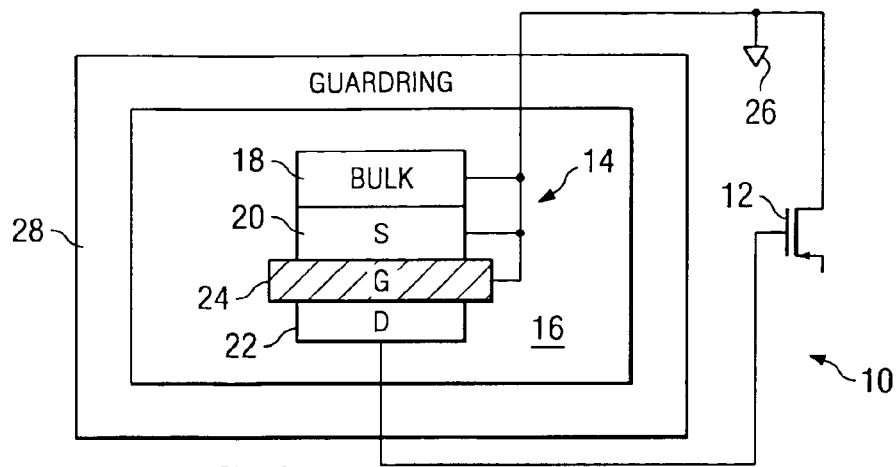
FIG. 1 is a diagram of a MOS device protected by an electrostatic discharge device that incorporates a guard ring according to the prior art.

A CDM clamp and guardring device according to the prior art is shown in FIG. 1. A CDM circuit 10 has a MOS device 12 that is electrically coupled to a CDM clamp device 14. The CDM clamp device 14 has a substrate 16 and a bulk substrate region 18, a source region 20 and a drain region 22, which have been formed in the substrate 16. Depending on the composition of the substrate 16 and regions 18, 20, 22, the CDM clamp device 14 may be an NMOS device or a PMOS device, which are commonly known to those of ordinary skill in the art of MOS fabrication.

A gate 24 is electrically connected via metal to the bulk region 18 and the source region 20, in the case of the NMOS to the substrate potential—generally ground. If the MOS device 12 becomes charged and discharges to ground 26 through the CDM clamp device 14, the CDM clamp device 14 prevents destruction of the MOS device 12 by turning on when the discharged voltage is present. When turned on, the CDM clamp device 14 essentially absorbs the discharged voltage and prevents degradation or destruction of the gate in the MOS device 12.

A sacrificial guardring 28, which surrounds the CDM clamp device 14, serves as a sacrificial collector to prevent latch-up or disruption of operation of the surrounding circuitry. The sacrificial guardring 28 is to prevent carriers that may be injected into the substrate 16 during a negative transient event on the input from being collected by other N-type diffusions (N-type source/drains or PMOS N-type wells), which could lead to latch-up at the worst, or merely disruption of performance at the best. The sacrificial guardring 28 (also referred to as a Substrate-Injection Guardring, or SIG) collects carriers injected into the substrate from the centric drain region of the CDM clamp device 14. The CDM clamp device 14 is not likely to latch up by itself, but could initiate latch-up in adjacent circuitry. The CDM clamp device 14, therefore, must be electrically connected to some potential, and the greater that potential, the more effective the sacrificial guardring 28.

The sacrificial guardring 28, however, consumes valuable device area and increases the distance between the CDM clamp and the protected devices, which adversely affects the level of protection for the devices. Accordingly, there is a need for a CDM protection device that provides better protection for MOS structures without increasing package size.

Figure 2:
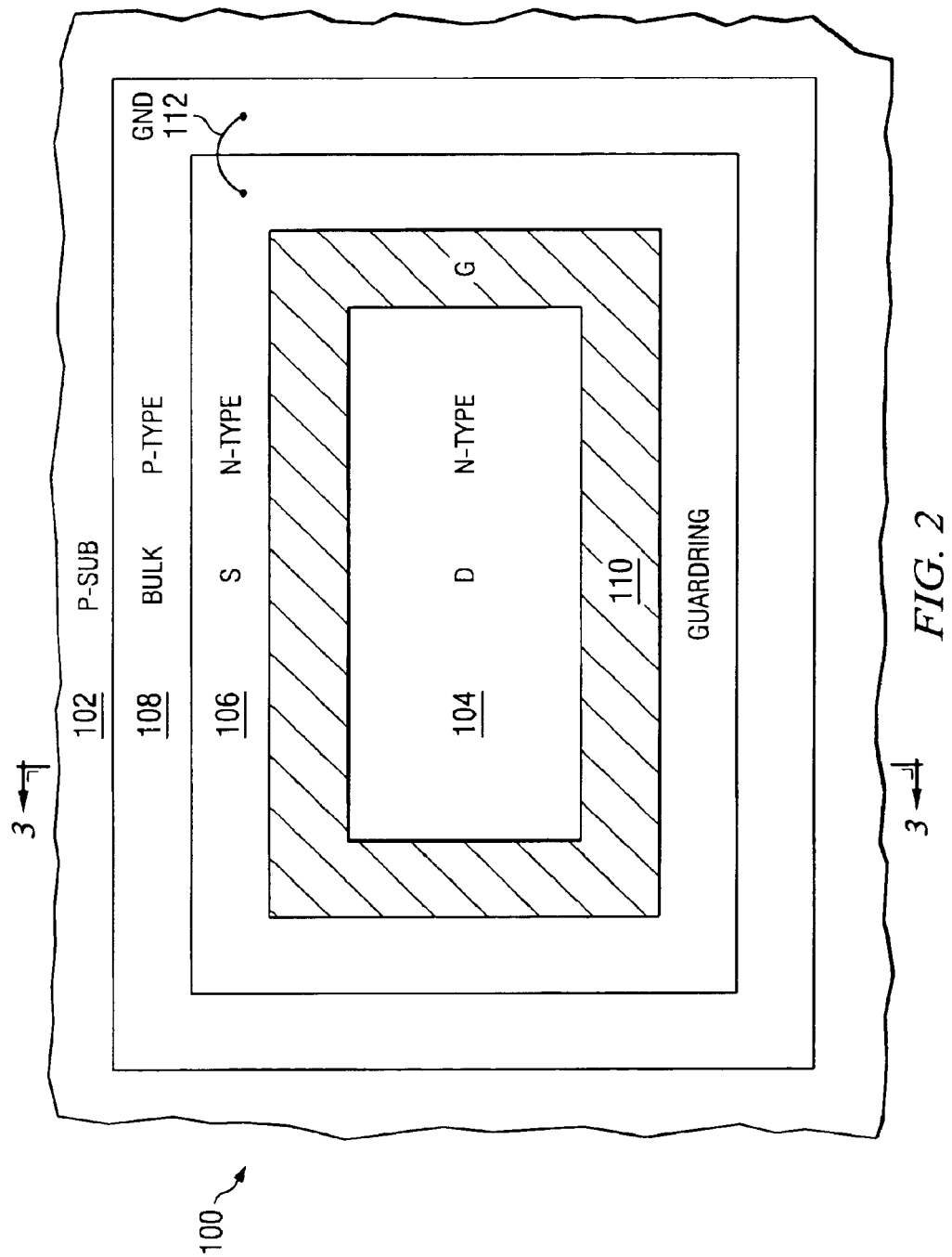
FIG. 2 is a diagram of an electrostatic discharge protection device according to one embodiment of the present invention.

Turning now to one embodiment of the present invention, a schematic plan view of an integral substrate injection guardring MOS device 100 is depicted in FIG. 2. The MOS device 100 may be a CMOS inverter or other gate, or amplifier input. The MOS device 100 may also be any other MOS device, which will be apparent to those having ordinary skill in the art of semiconductor design and fabrication. The MOS device 100 is fabricated on a substrate 102, which, in this particular embodiment, is a P-type substrate 102. Those having ordinary skill in the art of MOS device fabrication will recognize that the substrate 102 may have other compositions or characteristics and not depart from the scope of the invention. The MOS device 100 has a drain region 104, a source region 106 and a bulk region 108, which have been formed in the substrate 102. A gate 110 electrically contacts the drain region 104 and the source region 106. The source region 106 and the bulk region 108 are electrically coupled to ground 112.

In this particular embodiment, the drain region 104 and the source region 106 are N-type regions formed within the P-type substrate 102. The bulk region 108 is a P-type region. Other configurations and compositions of the regions 104, 106 and 108 will be obvious to those skilled in the art of MOS fabrication. Additionally, these regions 104, 106 and 108 may be formed in the substrate 102 using known fabrication methods and processes such as diffusion, ion implantation, and the like.

As depicted in this plan view, the drain region 104 is generally central to the MOS device 100. The source region 106 is annular and generally surrounds the drain region 104. The source region 106, consequently acts as both a source for the MOS device 100 and as a guardring or sacrificial collector in an electrostatic discharge protection circuit (not shown). By performing these two functions with a single source region 106, the present invention provides a guardring that is very near the protected device and also requires less area than a conventional guardring structure. Manufacturing efficiency and device performance are therefore increased and costs are reduced. Manufacturing is more efficient because one structure is serving two purposes. Additionally, the architecture and structure of the MOS device 100 may be smaller because a large guardring that encircles an entire MOS feature is not needed.

The bulk region 108 is also annular and generally surrounds the source region 106. The drain region 104, the source region 106, and the bulk region 108 in conjunction with the gate region 110, form the MOS device 100. As in typical MOS devices, the gate region 110 may be formed according to methods and processes known by those having ordinary skill in the art of MOS fabrication. Typically, a gate oxide is grown over the substrate and between the drain region 104 and the source region 106. A polysilicon layer may then be formed over the gate oxide. Silicon dioxide is deposited over the MOS device 100 and contact openings are cut. Finally, metal contact pads are formed to provide electrical connections to the gate region 110.

Figure 3:
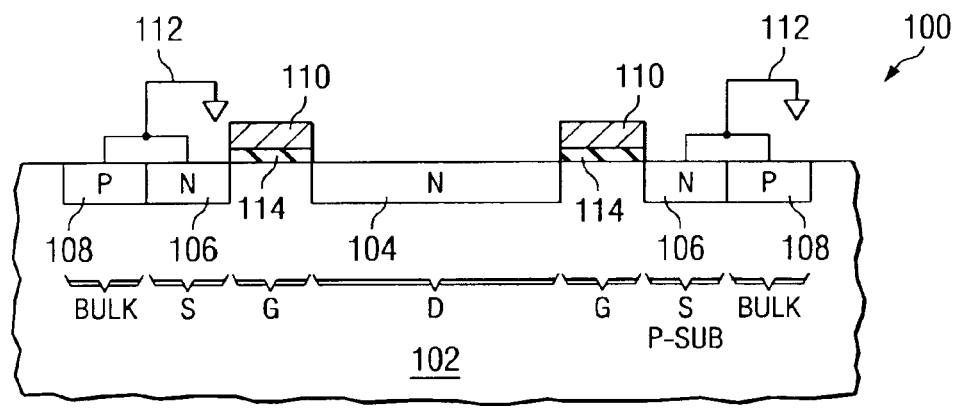
FIG. 3 is a diagram of an electrostatic discharge protection device according to one embodiment of the present invention taken along section line A—A in FIG. 2.

Turning now to FIG. 3, a cutaway diagram of the MOS device 100 taken along Section A—A of FIG. 2 is depicted. This figure depicts the drain region 104, source region 106 and bulk region 108 formed within the substrate 102. Additionally, the gate 110, which is electrically connected to the source region 106 and isolated from the drain region 104 by a gate oxide 114, is formed over the substrate 102.

Figure 4:
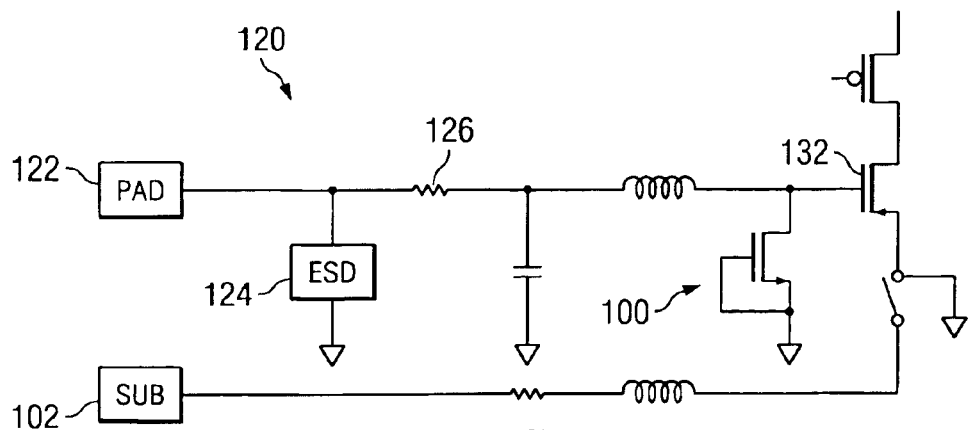
FIG. 4 is a schematic electrical diagram of an electrostatic discharge protection device incorporating certain embodiments of the invention.

Referring now to FIG. 4, MOS device 100 is used as a CDM clamp in an electrostatic discharge protected circuit 120. MOS device 100 may be closely coupled to an input device 132, which may be a CMOS inverter, for example. The gate of input device 132 is connected to a voltage supply via a contact pin through pad 122. A resistor 126 in the electrical path between the gate of the input device 132 and the pad 122 serves to limit the current delivered to the gate. An electrostatic discharge protection device 124 operates to send excess, potentially damaging voltage to ground, i.e. the substrate 102.

As mentioned above, the MOS device 100 may be closely coupled to the input device 132. Close coupling is possible because the guardring 106 is integral to the MOS device 100. Additionally, when the MOS device 100 functions as a CDM clamp device, the overall size of the electrostatic discharge protected circuit 120 is smaller because a large, additional guardring is not necessary. The MOS device 100 according to the present invention is protected from electrostatic discharges of up to 500 volts.

Although this invention has been described with reference to an illustrative embodiment, this description is not intended to limit the scope of the invention. Various modifications and combinations of the illustrative embodiments as well as other embodiments of the invention will be apparent to persons skilled in the art upon reference to the description. It is therefore intended that the appended claims accomplish any such modifications or embodiments.

What is claimed is:

1. A MOS device comprising:
   a P-type substrate, the P-type substrate having a bulk region;
   an N-type drain region formed within the substrate;
   an annular N-type source region generally surrounding the drain region, the source region serving as both the source for the MOS device and a sacrificial collector guardring;
   an annular gate region generally surrounding the drain region; the gate region electrically coupled to the source region and the bulk region; and
   an annular P-type base region that generally surrounds the source region and is electrically connected to the source region.

2. The MOS device of claim 1, wherein the N-type source region and the P-type base region are electrically coupled to ground.

3. The MOS device of claim 1, wherein the MOS device is a CDM clamp.

4. The MOS device of claim 1, wherein the MOS device is closely coupled to an input device.

5. The MOS device of claim 4, wherein the input device is a MOS device.

6. The MOS device of claim 1, wherein the MOS device is electrically connected in parallel with an electrostatic discharge protection device.

7. A CDM clamp device, comprising:
   a substrate;
   a drain region formed within the substrate;
   an annular source region formed within the substrate and generally surrounding the drain region, the annular source region functioning as both a source for the CDM clamp device and a guardring in the CDM clamp device;
   an annular base region formed within the substrate and generally surrounding the annular source region.

8. The CDM clamp device of claim 7, wherein the substrate is a P-type region.

9. The CDM clamp device of claim 7, wherein the drain region is an N-type region.

10. The CDM clamp device of claim 7, wherein the base is a P-type region.

11. The CDM clamp device of claim 7, further comprising an annular gate region over and electrically insulated from the drain region and the source region.

12. The CDM clamp device of claim 7, further comprising an input device, the input device closely coupled to the CDM clamp device.

13. The CDM clamp device of claim 12, wherein the input device is a MOS device.

14. A method for fabricating a CDM clamp comprising the steps of:
    forming a drain in a substrate;
    forming an annular source around the drain, the source serving as a guardring for the CDM clamp; and
    forming an annular base around the source and the drain.

15. The method of claim 14, wherein the substrate is a P-type material.

16. The method of claim 14, wherein the substrate is an N-type material.

17. The method of claim 14, wherein the drain is a P-type material.

18. The method of claim 14, wherein the drain is an N-type material.

19. The method of claim 14, wherein the source is a P-type material.

20. The method of claim 14, wherein the source is an N-type material.

21. The method of claim 14, wherein the base is a P-type material.

22. The method of claim 14, wherein the base is an N-type material.

23. The method of claim 14, further comprising the step of forming an annular gate generally surrounding the drain; the gate electrically connected to the source.

24. The method of claim 14, further comprising the step of electrically connecting an ESD protection circuit in parallel with the CDM clamp.

* * * * *